(12) United States Patent
Jun (10) Patent No.: US 10,991,843 B2
(45) Date of Patent: Apr. 27, 2021

(54) SOLAR CELL AND METHOD FOR PREPARING SAME

(71) Applicant: Young-Kwon Jun, Seoul (KR)

(72) Inventor: Young-Kwon Jun, Seoul (KR)

( * ) Notice: Subject to any disclaimer, the term of this patent is extended or adjusted under 35 U.S.C. 154(b) by 0 days.

(21) Appl. No.: 16/724,397

(22) Filed: Dec. 23, 2019

(65) Prior Publication Data

US 2020/0152819 A1    May 14, 2020

Related U.S. Application Data

(62) Division of application No. 15/777,213, filed as application No. PCT/KR2017/001840 on Feb. 20, 2017, now abandoned.

(30) Foreign Application Priority Data

Feb. 18, 2016   (KR) .................. 10-2016-0019191

(51) Int. Cl.
| | | |
|---|---|---|
| H01L 31/18 | (2006.01) |
| H01L 31/0288 | (2006.01) |
| H01L 31/0216 | (2014.01) |
| H01L 31/0392 | (2006.01) |
| H01L 31/0336 | (2006.01) |
| H01L 31/032 | (2006.01) |

(52) U.S. Cl.
CPC .......... *H01L 31/18* (2013.01); *H01L 31/0216* (2013.01); *H01L 31/0288* (2013.01); *H01L 31/0323* (2013.01); *H01L 31/0327* (2013.01); *H01L 31/0392* (2013.01); *H01L 31/03365* (2013.01); *Y02E 10/50* (2013.01); *Y02P 70/50* (2015.11)

(58) Field of Classification Search
None
See application file for complete search history.

(56) References Cited

U.S. PATENT DOCUMENTS

2014/0127440 A1    5/2014   Norfolk et al.
2015/0287848 A1    10/2015  Jun

FOREIGN PATENT DOCUMENTS

| JP | 3423280 B2 | 7/2003 |
| KR | 10-2014-0031121 A | 3/2014 |
| KR | 10-2014-0058383 A | 5/2014 |
| KR | 10-2014-0146998 A | 12/2014 |
| KR | 10-2015-0050315 A | 5/2015 |

OTHER PUBLICATIONS

Masudy-Panah et al., Solar Energy Materials & Solar Cells, 140 (2015) 266-274. (Year: 2015).*

(Continued)

*Primary Examiner* — Eli S Mekhlin
(74) *Attorney, Agent, or Firm* — Revolution IP, PLLC (57) ABSTRACT

A method for preparing a solar cell, includes: forming a first electrode on a substrate; forming a light absorbing layer on the first electrode; and forming a second electrode on the light absorbing layer, wherein the method further comprises forming an impurity material layer including an impurity element on the light absorbing layer adjacent to the first electrode or the second electrode in any one side or both sides thereof, and forming a doping layer by diffusing the impurity element into a portion of the light absorbing layer.

11 Claims, 4 Drawing Sheets

(56) References Cited

OTHER PUBLICATIONS

Septina et al., Chem. Mater. 2017, 29, 1735-1743. (Year: 2017).*
Azevedo et al., Energy Environ. Sci., 2014, 7, 4044-4052. (Year: 2014).*
International Search Report for PCT/KR2017/001840 dated Apr. 25, 2017 from Korean Intellectual Property Office.
Masudy-Panah et al., "Titanium doped cupric oxide for photovoltaic application", Solar Energy Materials & Solar Cells, 140 (2015) 266-274. (Year: 2015).
Septina et al., "Stabilized Solar Hydrogen Production with CuO/CdS Heterojunction Thin Film Photocathodes", Chemistry of Materials, 2017, 29, 1735-1743. (Year: 2017).
Azevedo et al., "On the stability enhancement of cuprous oxide water splitting photocathodes by low temperature steam annealing", Energy & Environmental Science, 2014, 7, 4044. (Year: 2014).

* cited by examiner

SOLAR CELL AND METHOD FOR PREPARING SAME

CROSS REFERENCE TO PRIOR APPLICATION

This application is a divisional Application of U.S. patent application Ser. No. 15/777,213 filed on May 18, 2018 under 35 U.S.C. § 120, which is the 35 U.S.C. § 371 national stage of International application PCT/KR2017/001840 filed on Feb. 20, 2017, which claims priority to Korean application 10-2016-0019191 filed on Feb. 18, 2016, the entire contents of each of the above-identified applications are hereby incorporated by reference.

BACKGROUND

The present invention relates to a solar cell and a method for preparing the same, and more particularly, to a solar cell structure in which an internal electric field such as a p-n junction is formed by forming an impurity doping layer containing Ti or Si impurities in a Cu compound or Cd compound solar cell which includes an amorphous, polycrystalline or single crystal solar cell to improve the photoelectric conversion efficiency of the solar cell, and to a preparation method thereof.

A silicon solar cell is a crystalline solar cell including a single crystal solar cell and a polycrystalline solar cell and has the largest market share at present. Technologies for preparing silicon solar cells with high efficiency at low costs are being developed.

For the past 20 years, the most efficient silicon solar cell in the world has been a cell with 25% efficiency using the PERL (Passive Emitter Rear Locally Diffused) structure developed by University of New South Wales, Australia. However, at the IEEE Photovoltaic Specialists Conference in April 2014, Panasonic Corporation announced that they achieved a solar cell efficiency of 25.6% by adopting a new structure. In this solar cell, a front contact for blocking some of the sunlight entering the solar cell is changed such that both positive and negative contacts are located on a rear surface of the solar cell. In addition, a high quality amorphous silicon film is formed on a crystalline silicon wafer so as to prevent damage to a surface of the wafer, thereby minimizing the occurrence of recombination of carriers on front and rear surfaces, achieving an efficiency of 25.6% exceeding an efficiency wall of 25%.

However, all the designs related to this new efficiency record have the disadvantage of using a high quality silicon crystal, which makes it difficult to obtain economical efficiency.

On the other hand, a thin film solar cell technology is a next generation solar cell technology as compared with that of a crystalline Si solar cell. A thin film solar cell is a solar cell which has higher efficiency than a crystalline Si solar cell and which can be prepared at lower costs.

Many different types of thin film solar cells are being developed, and the representative example thereof is a CIGS(Cu(In, Ga)Se$_2$) solar cell.

A CIGS solar cell is a cell composed of a general glass substrate-a rear electrode-a light absorbing layer-a buffer layer-a transparent front electrode, and the like. Among the components, the light absorbing layer which absorbs sunlight is composed of CIGS or CIS(CuIn(S,Se)$_2$). CIGS may be used by replacing Cu, In, and Ga which are cations, and Se which is an anion with different metal ions or anions, respectively, each of which may be called as a CIGS-based compound semiconductor. The representative example thereof is Cu(In,Ga)Se$_2$ and such a CIGS-based compound semiconductor is a material of which the energy band gap as well as the crystal lattice constant may be controlled by changing the type and the composition of cations (for example: Cu, Ag, In, Ga, Al, Zn, Ge, Sn, and the like) and anions (for example: Se and S), both constituting the CIGS-based compound semiconductor. For example, recently, a material such as Cu$_2$ZnSnS$_4$(CZTS) or Cu$_2$Sn$_x$Ge$_y$S$_3$ (CTGS) (wherein, x and y are any positive numbers) is used as a low-cost compound semiconductor material.

However, such a composite compound semiconductor containing Cu has a multi-component structure, and therefore, there is a disadvantage in that it is difficult to have uniformity and reproducibility since it is difficult to optimize the composition by controlling each component material. In addition, a typical structure has a limitation in improving efficiency through the reduction in recombination of carriers, and the like.

SUMMARY

An object of the present invention is to provide a solar cell structure capable of improving photoelectric conversion efficiency by forming an internal electric field layer such as a p-n junction in a Cu compound or Cd compound semiconductor by doping Ti or Si impurities as a donor so as to reduce the recombination of electrons and holes both generated in the semiconductor by means of light absorption while improving collection efficiency to an electrode, and a preparation method thereof.

In addition, another object of the present invention is to provide a Cu compound or Cd compound semiconductor solar cell applying an internal electric field formed by the impurity doping as a means for preventing recombination, and a preparation method thereof.

In particular, another object of the present invention is to provide a solar cell which enables the improvement of uniformity and reproducibility by applying a Cu compound or Cd compound semiconductor having a binary composition as a light absorbing layer.

The first aspect of the present invention to solve the above mentioned task provides a solar cell including a light absorbing layer composed of a Cu compound or Cd compound and formed between two electrodes facing each other, an impurity material layer formed on any one side or both sides between the two electrodes and the light absorbing layer and including an impurity element to be provided to the Cu compound or Cd compound, and a doping layer formed on a portion of the light absorbing layer by means of the impurity element being diffused into the light absorbing layer.

The second aspect of the present invention to solve the above mentioned task provides a method for preparing a solar cell, including forming a first electrode on a substrate, forming a light absorbing layer on the first electrode, and forming a second electrode on the light absorbing layer, wherein the method further includes forming an impurity material layer including an impurity element on the light absorbing layer adjacent to any one side or both sides of the first electrode or the second electrode, and forming a doping layer by diffusing the impurity element into a portion of the light absorbing layer.

A solar cell according to the present invention is capable of improving efficiency by reducing the recombination of electrons and holes generated in a semiconductor light absorbing layer and at the same time improving the collection efficiency to an electrode by arranging a material layer capable of impurity doping so as to be adjacent to a light absorbing layer and forming an internal electric field such as a p-n junction through the impurity doping.

In addition, a solar cell according to the present invention is capable of simplifying a process by replacing a typical recombination preventing layer by disposing an impurity material layer so as to be adjacent to a conductive material such as an electrode of a cell.

In addition, according to a method for preparing a solar cell according to the present invention, an impurity material layer may be formed by applying a vacuum deposition method such as reactive ion sputtering or electron beam evaporation, or by a non-vacuum method such as electroplating, ink printing, and spray pyrolysis.

In addition, according to a method for preparing a solar cell according to the present invention, a binary compound semiconductor containing Cu or Cd is applied as a light absorbing layer so that the light absorbing layer may be further simplified to facilitate the control of physical properties and be stably maintained. As a result, the efficiency of a solar cell is expected to be maintained for a longer time.

DETAILED DESCRIPTION

Hereinafter, the configuration and the operation of embodiments of the present invention will be described with reference to the accompanying drawings.

In describing the present invention, a detailed description of related known functions and configurations will be omitted when it may unnecessarily make the gist of the present invention obscure. Also, when a certain portion is referred to "include" a certain element, it is understood that it may further include other elements, not excluding the other elements, unless specifically stated otherwise.

The present invention is characterized in providing a solar cell including a light absorbing layer composed of a Cu compound or Cd compound and formed between two electrodes facing each other, an impurity material layer formed on any one side or both sides between the two electrodes and the light absorbing layer and including a donor element to be provided to the Cu compound or Cd compound, and a doping layer formed on a portion of the light absorbing layer by means of the donor element being diffused into the light absorbing layer.

A p-n junction or an internal electric field layer may be formed in the Cu compound or Cd compound by the doping layer.

A light absorbing layer material may include, for example, a binary compound containing Cu and having an energy band gap of 1.0-2.1 eV, such as CuO, $Cu_2O$, CuS, and $Cu_2S$ as a p-type semiconductor. $Cu_xO_y$, and $Cu_xS_y$ (x and y are any positive numbers) may be preferably used. In addition, $Cd_xTe_y$ (wherein, x and y are any positive numbers) may also be preferably used.

The impurity material layer may include a material which belongs to a group IV or containing an element having four valence electrons or an oxidation number of +4, and may be preferably composed of a metal oxide containing any one or more of Ti and Si.

In addition, the solar cell may exhibit a fluctuation in current as voltage is applied in a light irradiation state. The fluctuation in current may be a current variation of 20% or more with respect to a voltage variation of within 5%. In addition, the fluctuation in current can be reduced to as a current variation to be within 10% with respect to a voltage variation of within 10% through polling which intensifies an internal electric field. That is, according to the present invention, the fluctuation in current can be reduced to as a current variation to be within a certain range with respect to a voltage variation through polling which intensifies the internal electric field of the doping layer. In addition, the fluctuation in current can be reduced to as the number of times a fluctuation appears decrease through polling which intensifies the internal electric field.

In addition, the present invention is characterized in providing a method for preparing a solar cell, including forming a first electrode on a substrate, forming a light absorbing layer on the first electrode, and forming a second electrode on the light absorbing layer, wherein the method further includes forming an impurity material layer including a donor element on the light absorbing layer adjacent to any one side or both sides of the first electrode or the second electrode, and forming a doping layer by diffusing the donor element into a portion of the light absorbing layer.

The impurity material layer may be formed by a vacuum deposition process such as physical vapor deposition (PVD), chemical vapor deposition (CVD), and atomic layer deposition (ALD), a non-vacuum thin film process such as plating, ink printing, and spray pyrolysis, or by a method of attaching a film containing an impurity material.

The method of attaching a film may include preparing a solution by dispersing particles of the impurity material in an organic solvent, applying the solution on the light absorbing layer, and forming a particle layer of the impurity material by evaporating the solvent.

In addition, the method of attaching a film may include forming a film by impregnating the particles of the impurity material into a solvent of thermoplastic resin and then curing the impregnated particles, and attaching the film on the light absorbing layer.

At this time, the size of the particles of the impurity material may be 10 nm to 100 nm, and a preferable size of the particles is about 50 nm.

The impurity material layer is formed by reactive ion sputtering, and when the impurity material layer is formed, a negative voltage may be applied in a range of 0 V to −5 V to accelerate the doping of the donor element contained in impurities into the light absorbing layer.

At this time, the reactive ion sputtering may include providing a target having a component of the impurity material and injecting an inert gas and a reactive gas in a vacuum state, and forming an oxide by generating plasma to cause the impurity material emitted by means of an Ar ion colliding with the target to react with oxygen plasma.

The impurity material layer is composed of a metal oxide preferably including any one of a Ti oxide ($Ti_xO_y$), a composite oxide of Cu and Ti ($Cu_xTi_yO_z$), and a composite oxide of Cu and Si ($Cu_xSi_yO_z$), and may be formed by physical vapor deposition (PVD), chemical vapor deposition (CVD), or atomic layer deposition (ALD).

The Ti oxide may be formed by atomic layer deposition using a precursor containing Ti.

In addition, the doping layer may be formed through a heat treatment simultaneously forming an impurity doping layer.

In addition, the impurity material layer may be applied to replace a typical insulating layer of $Al_2O_3$, and the like which is used as a recombination preventing layer in a compound semiconductor solar cell.

EXAMPLE

Figure 1:
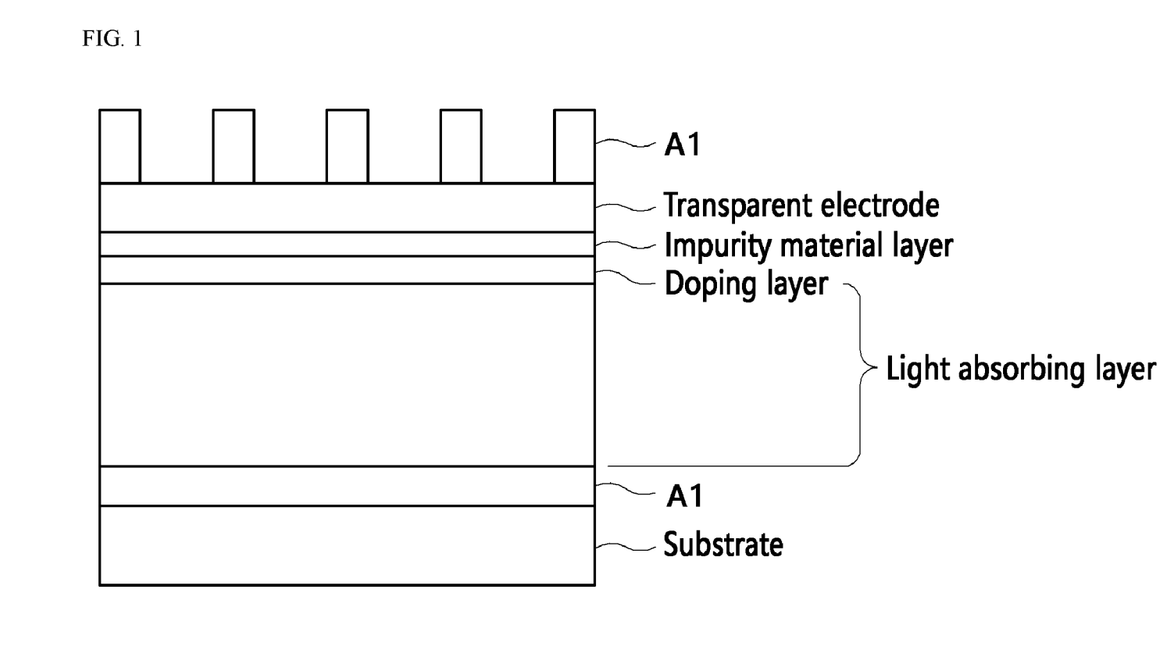
FIG. 1 is a schematic view showing a cross-sectional structure of a Cu compound semiconductor solar cell including an impurity material layer according to an embodiment of the present invention.

FIG. 1 is a schematic view of a Cu compound solar cell including an impurity material layer for doping an impurity material according to an embodiment of the present invention.

As shown in FIG. 1, a Cu compound solar cell according to an embodiment of the present invention includes a substrate, an Al electrode formed on the substrate, a Cu compound semiconductor layer formed on the Al electrode and serving as a light absorbing layer, an impurity material layer formed on the Cu compound semiconductor layer, a transparent electrode formed on the impurity material layer, and an Al grid formed on the transparent electrode, and a diffusion layer of a donor element such as Ti or Si which the impurity material layer includes is formed in a predetermined region from an interface in contact with the impurity material layer to the inside of the Cu compound semiconductor layer.

A preparation process of a solar cell having the above-described structure is as follows.

First, as a substrate, soda lime glass having a thickness of 3 mm was used.

Next, as a rear electrode, an Al thin film was formed to a thickness of about 1 to 2 μm by using a sputtering method. As a rear electrode material, a conductive material such as Mo and W may be used in addition to Al. In addition, a conductive material such as Al may be formed by applying a low-cost non-vacuum method such as electroplating, ink printing, and spray pyrolysis in addition to a vacuum deposition method such as sputtering.

Thereafter, on the Al thin film, a thin film of $Cu_xO_y$ or $Cu_xS_y$ (wherein, x and y are any positive numbers), which is a p-type semiconductor, was formed to a thickness of 1 to 5 μm by applying a sputtering method which has a high deposition rate to form a light absorbing layer composed of a binary Cu compound semiconductor.

Specifically, the light absorption layer is formed by using a material having a purity of 99.99% or more and having a compound composition containing Cu, O, or S as a sputtering target, and by performing a deposition step of an electric polarization layer by reactive ion sputtering, the step of which is divided into four sections for each time period. First, a sputtering target material is provided using a material containing Cu or S, for example, Cu, or CuS, and the like. Thereafter, Ar, as a carrier gas, and $O_2$ or $S_2$, as a reaction gas, are injected. Next, plasma is generated to emit metal atoms from the target material using Ar ions. Finally, a Cu compound containing Cu and O, or Cu and S is formed by means of oxygen or sulfur ions generated from the reaction gases reacted with the emitted metal atoms to form a Cu compound thin film containing $Cu_xO_y$ or $Cu_xS_y$.

The light absorbing layer may be formed to a thickness of about 1 to 5 μm by the sputtering, under the conditions of a process temperature of 200° C. or less, a process pressure of 2 mTorr, an Ar flow rate of 20 to 50 sccm, a $O_2$ flow rate of 10 to 30 sccm, and a direct current voltage of 500 to 800 V. The most preferable process conditions of 300° C. and 30 minutes may be applied to form a light absorbing layer of a thickness of about 2 μm containing a Cu compound such as $Cu_xO_y$ or $Cu_xS_y$.

The light absorbing layer may also be formed by applying a low-cost non-vacuum method such as electroplating, ink printing, and spray pyrolysis in addition to a vacuum deposition method such as sputtering.

Thereafter, on the light absorption layer, an impurity material layer is formed to a thickness of about 100 nm or less by deposition.

When the thickness of the impurity material layer is less than 10 nm, doping amount is insufficient, and when greater than 100 nm, resistance is increased due to a residual thickness. Therefore, it is most preferable to form the impurity material layer at a thickness of 10 to 100 nm.

Specifically, when an oxide is applied as the impurity material, a thin film of a Ti oxide, a Cu and Ti composite oxide, or a Cu and Si composite oxide is formed to a thickness of about 50 nm by an RF sputtering method, which is advantageous in deposition rate, to form an impurity material layer.

Specifically, when forming the thin film of a Cu and Ti composite oxide, a material having a purity of 99.99% or more and having a compound composition containing Cu, Ti, and S is used as the sputtering target.

The deposition step of the impurity material layer by a reactive ion RF sputtering method is divided into four sections for each time period. First, a sputtering target material is provided using a material containing Cu, TI, and O, for example, $CuTiO_3$, and the like. Thereafter, Ar as a carrier gas, and $O_2$ as a reaction gas, are injected. Next, plasma is generated to emit metal atoms from the target material using Ar ions. Finally, an oxide containing Cu and Ti is formed by means of oxygen ions reacted with the emitted metal atoms to form a thin film containing a Cu and TI composite compound ($Cu_xTi_yO_z$).

The impurity material layer of a thickness of about 10 nm to 100 nm may be formed by the RF-sputtering under the conditions of a process temperature of 200° C. or less, a process pressure of 5 mTorr, an Ar flow rate of 20 to 50 sccm, a $O_2$ flow rate of 10 to 30 sccm, an AC frequency of 2.5 to 3 MHz, a voltage of 300 to 500 V, and time of within 10 minutes. Preferably, an impurity material layer of 50 nm including a $Cu_xTi_yO_z$ composite oxide such as $CuTiO_3$ and the like may be formed by applying the conditions of 200° C. and 4 minutes.

In addition, when forming a thin film of a Cu and Si composition oxide ($Cu_xSi_yO_z$), an impurity material layer may be formed in a similar manner as in the case of a $Cu_xTi_yO_z$ thin film.

In addition, a p-n junction or an internal electric field may be formed by forming a $Cu_xTi_yO_z$ thin film or a $Cu_xSi_yO_z$ thin film on a Cu compound semiconductor, or by a method in which Ti atoms or ions are diffused to be doped into a portion of the light absorbing layer through a heat treatment after the formation.

On the other hand, in the case of forming a Ti oxide ($Ti_xO_y$) thin film, an impurity material layer may be formed through, for example, a step of adsorbing a precursor in which a Ti compound is mixed to the light absorbing layer by using atomic layer deposition, and a step of forming an oxide by oxidizing the adsorbing layer of the precursor in which a Ti compound is mixed.

More specifically, in the case of forming a $Ti_xO_y$ thin film, tetrakis(dimethylamino)titanium(TDMAT:Ti[N($CH_3$)$_2$]$_4$), tetrakis(diethylamido) titanium(TDEAT:Ti[N($C_2H_5$)$_2$]$_4$), tetrakis(ethylmethylamido)titanium(TEMAT:Ti [N($C_2H_5$)($CH_3$)]$_4$), titanium tetraisopropoxide(TTIP:Ti[OCH($CH_3$)$_2$]$_4$), and the like may be used as a Ti compound precursor.

The atomic layer deposition step is performed by repeating a process divided into four sections for each time period.

First, an adsorbing layer of a precursor material (a Ti compound) is formed by adsorbing the precursor material using a Ti compound precursor having Ar as a diluent gas (the first step). Then, by-products and residual gas are removed using an Ar gas (the second step). Next, plasma is generated while oxygen is injected to be subjected to an oxidation reaction with the adsorbing layer (the third step). Finally, by-products and residual gas are removed using an Ar gas (the fourth step) to form a $TiO_2$ thin film or an oxide film of a Ti compound.

For example, the first step is performed for 0.3 to 5 seconds, the second step is performed for 10 to 20 seconds, the third step is performed for 3 to 5 seconds, and the fourth step is performed for 10 to 20 seconds. The four steps are considered to be one cycle, and by repeating 100 to 500 cycles according to a film formation thickness and a film formation rate (about 0.1 nm/sec) under a reaction temperature of 100 to 300° C., the impurity material layer may be formed to a thickness of 50 nm.

Preferably, under a temperature of 200° C., an impurity material layer of about 50 nm composed of an oxidized material of a Ti compound is formed by causing $TiO_2$ and a Cu compound semiconductor formed by applying 500 cycles of atomic layer deposition which is composed of 1 second of the first step, 10 seconds of the second step, 3 seconds of the third step, and 5 seconds of the fourth step to react with each other chemically. At this time, a gas injection rate of 50 sccm may be applied at each step, and in the first step, hydrogen ($H_2$) gas may be simultaneously applied together with the Ti compound precursor.

In addition, a p-n junction or an internal electric field may be formed by forming a $TiO_2$ layer on the Cu compound semiconductor, or by a method in which Ti atoms and ions of the $TiO_2$ layer are diffused to be doped into the light absorbing layer through a heat treatment after the formation.

In addition, the impurity material layer may be formed by applying a low-cost non-vacuum method such as electroplating, ink printing, and spray pyrolysis in addition to a vacuum deposition method such as sputtering.

Next, as an upper portion electrode of the solar cell, a transparent electrode is formed by depositing a transparent conductive material on the electric polarization layer. At this time, as the transparent conductive material, a material such as indium tin oxide (ITO), zinc oxide (ZnO), aluminum-doped zinc oxide (Al-doped ZnO), and fluorine-doped tin oxide (F-doped $SnO_2$) may be formed by sputtering.

Finally, as an additional upper portion electrode, Ag is printed by screen printing and then firing heat treated to form an Ag grid, completing the preparation of the solar cell.

On the other hand, the impurity material layer is formed by first forming an electrode pattern, and then before performing the firing heat treatment, forming an impurity material on a front surface, a rear surface, or both surfaces by a vacuum deposition method such as sputtering, or a low cost non-vacuum method such as electroplating, ink printing, and spray pyrolysis. Thereafter, the firing heat treatment is performed to complete the preparation of the solar cell.

In addition, the impurity material layer may be formed using a method of first forming an electrode pattern, and then attaching a particle layer or a film containing the impurity material on a front surface, a rear surface, or both surfaces so as to be in contact with the electrode before or after the firing heat treatment.

In this case, a method of dispersing impurity particles containing a complex oxide such as $CuTiO_3$ or $CuSiO_3$ in an organic solvent such as acetone or toluene, coating the solution by a spray method, and evaporating the solvent to form a particle layer of impurities, and a method of impregnating strong impurity particles with a solvent of thermoplastic resin having a softening point of 120° C. or higher, such as polyethylene, polystyrene, and polyphenylene ether, followed by hardening to form a polymer film, and then laminating the film on a surface of the solar cell may be applied. At this time, the size of the impurity particles may be 10 nm to 100 nm, preferably about 50 nm.

In addition, during or after the formation of the impurity material layer, poling may be applied to enhance the internal electric field by applying reverse bias to the substrate. At this time, a reverse bias voltage is within a range of the reverse breakdown voltage of a Cu compound semiconductor diode, and may be preferably a negative voltage within 0 to −5 V.

Figure 2:
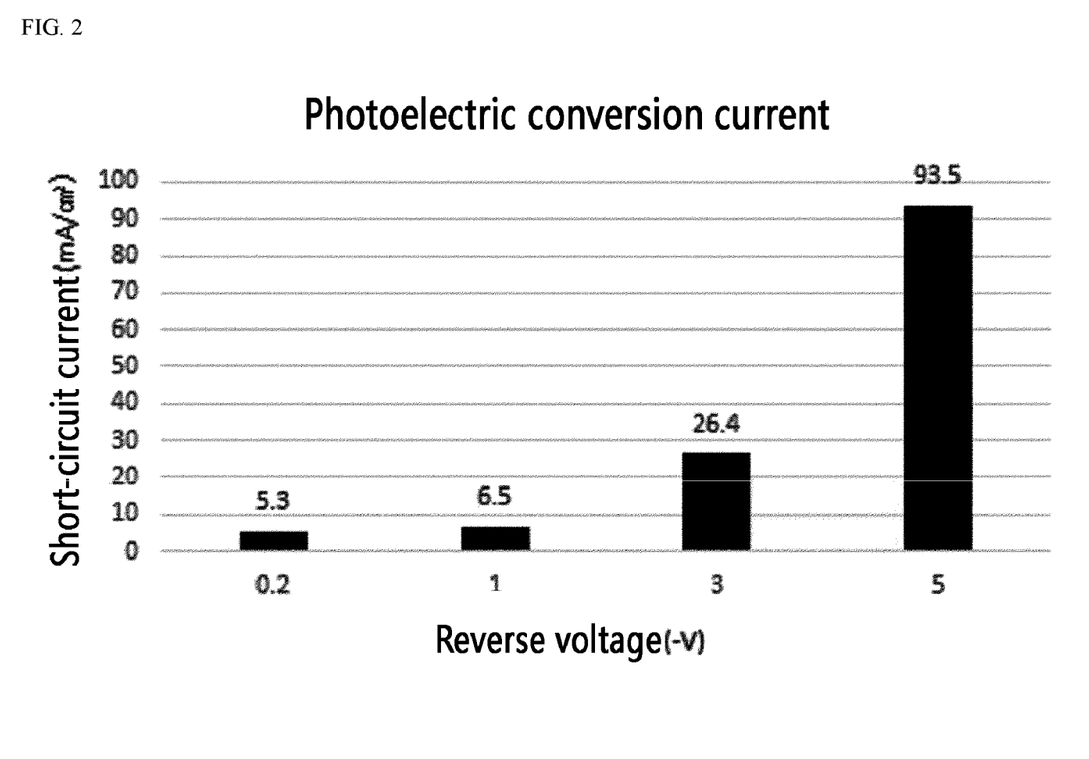
FIG. 2 is a graph showing a result of measurement of a change in photoelectric conversion current, that is, a short-circuit current according to the application of a reverse bias in a light irradiation state in a Cu compound solar cell including an impurity material layer according to an embodiment of the present invention.

FIG. 2 is a graph showing a result of measuring a short-circuit current while applying reverse bias in a light irradiation state in a Cu compound solar cell including an impurity material layer according to an embodiment of the present invention, and showing that the short-circuit current increases as polling is increased by the reverse bias.

As a result, the present invention exhibits an effect of increasing photoelectric conversion current by forming an internal electric field such as a p-n junction through a process of doping impurities into a Cu compound semiconductor to which an impurity material layer is adjacent so that the recombination of photo-excited charge carriers is reduced.

Figure 3:
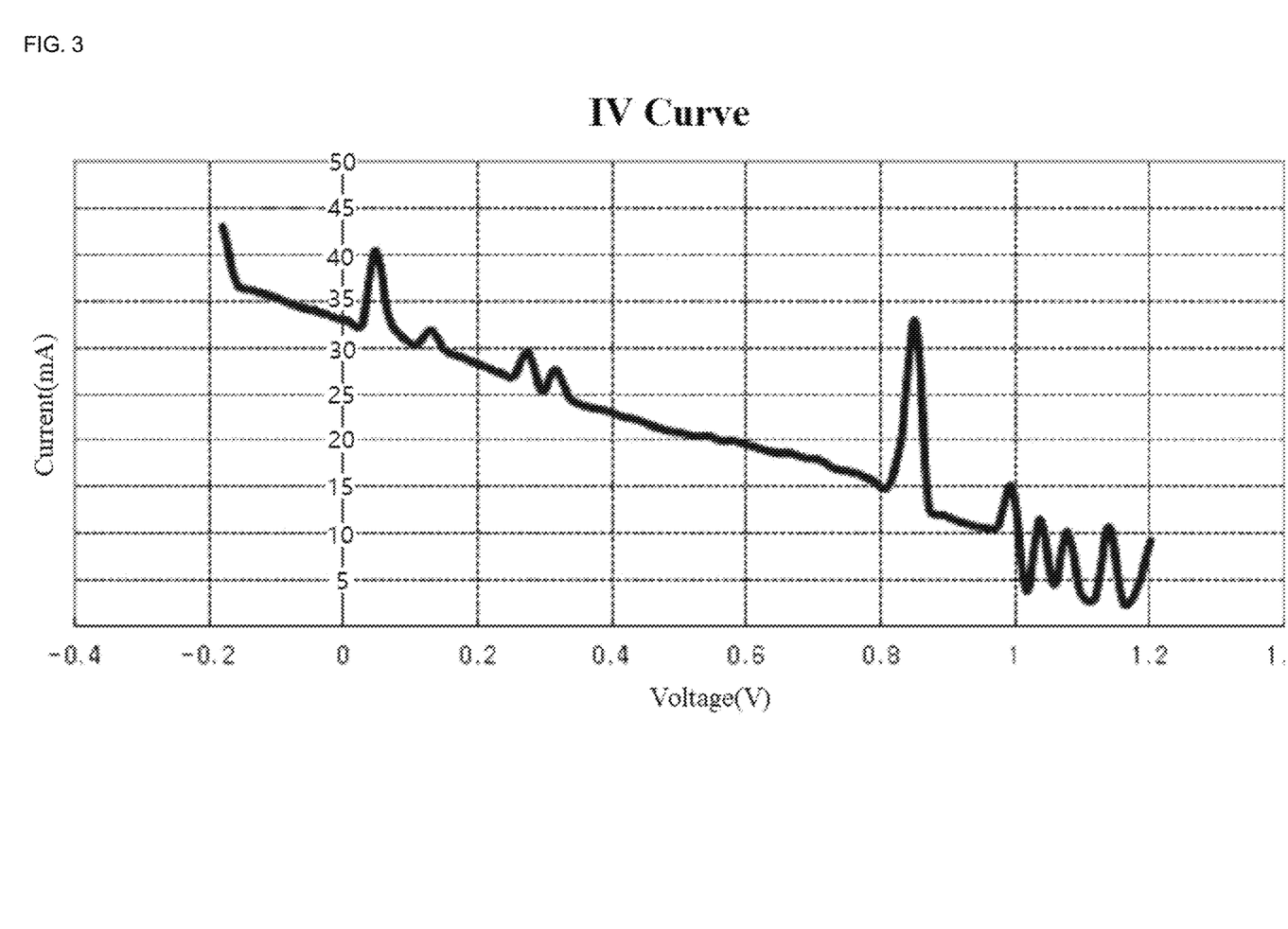
FIG. 3 shows a case (A) in which a current-voltage characteristic is measured in a light irradiation state in a Cu compound solar cell including an impurity material layer according to an embodiment of the present invention.

On the other hand, due to the characteristics of an internal electric field layer, when the change in current is measured while increasing or decreasing the range of voltage including operating voltage in a light irradiation state, the direction and the magnitude of an electric field in the internal electric field layer changes according to the applied voltage. Therefore, as shown in FIG. 3, current does not increase or decrease regularly with respect to the change in voltage, and irregular fluctuations appear.

The magnitude of such fluctuations may vary such that a variation of 20% to 120% (increase or decrease) in current may be exhibited, for example, with respect to a voltage variation (increase or decrease) of within 5%.

Figure 4:
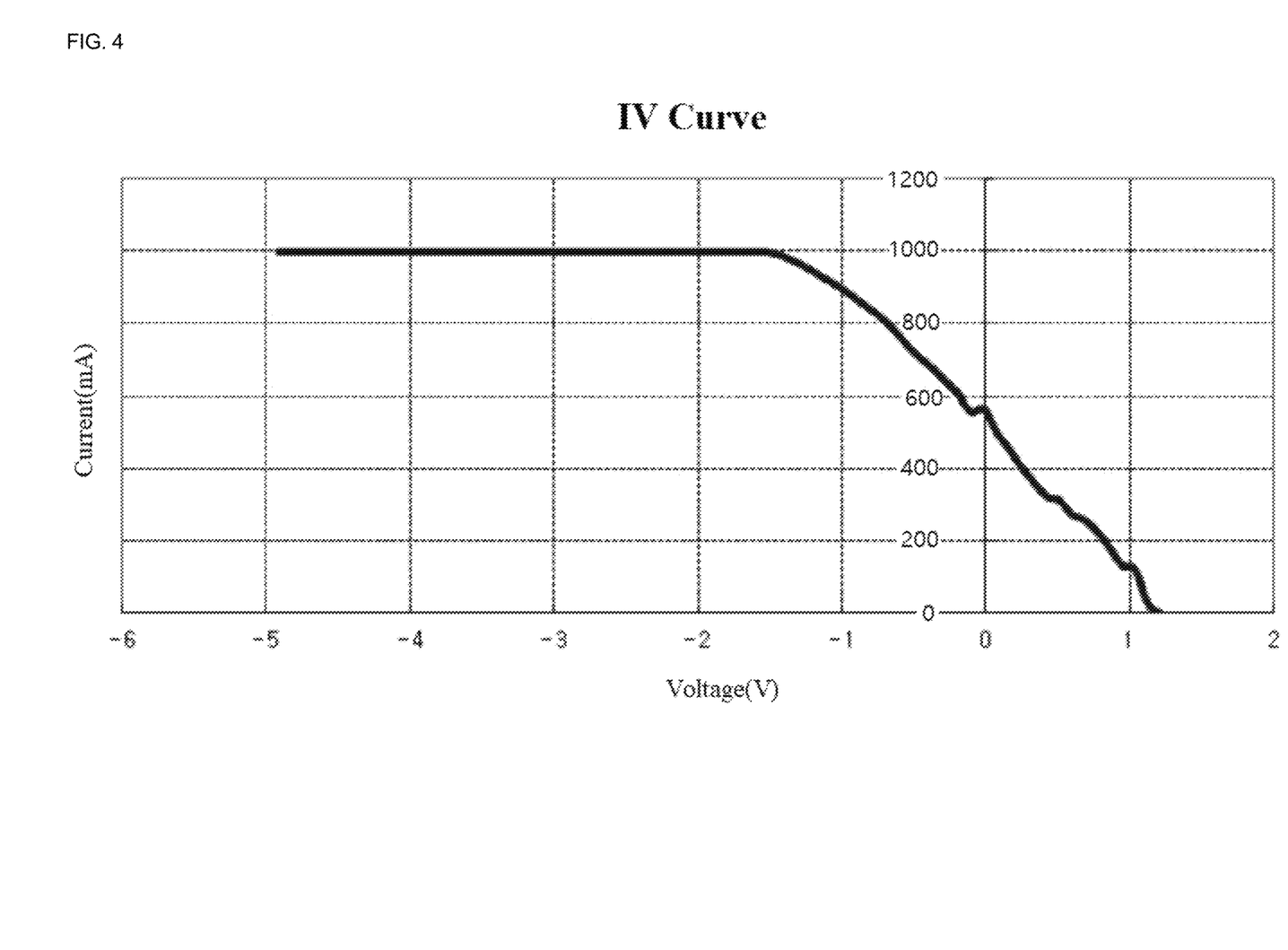
FIG. 4 shows a case (B) in which a current-voltage characteristic is measured after poling by applying a negative voltage (−5 V) in a Cu compound solar cell including an impurity material layer according to an embodiment of the present invention.

The irregular fluctuations are reduced if polling is performed which intensifies the internal electric field by applying an arbitrary reverse voltage or negative voltage to the internal electric field layer. As shown in FIG. 4, for example, a current variation can be reduced to as 10% or less with respect to a voltage variation of within 10%, and the number of times that a fluctuation, that is, an irregular increase or decrease, appears, is reduced.

On the other hand, in a Cu compound solar cell including an impurity material layer according to the embodiment of the present invention, as the number of types of components of a light absorbing layer is decreased from CIGS of four-component system, CIS(CuInS$_2$) of three-component system, Cu$_2$S of binary system, and the like, the reproducibility and the uniformity in the physical properties of the compound may be improved when the light absorbing layer is formed. Therefore, it is advantageous in terms of the uniformity, reproducibility and performance optimization of a solar cell that a binary Cu compound semiconductor of the present invention is applied as a light absorbing layer compared with a case in which a multi-component system is applied.

In addition, although a solar cell in which a binary semiconductor containing Cu is applied as a light absorbing layer is described in an embodiment of the present invention, a solar cell including a binary semiconductor light absorbing layer containing Cd, such as CdTe and Cd$_x$Te$_y$ (wherein, x and y are positive numbers) also has effects of forming an internal electric field, and increasing an efficiency by introducing an impurity material layer.

In addition, in the embodiment of the present invention, since a light absorbing layer composed of a binary semiconductor containing Cu or Cd, such as Cu$_x$O$_y$, Cu$_x$S$_y$, and Cd$_x$Te$_y$ (wherein, x and y are any positive numbers) is a p-type semiconductor, a solar cell having an impurity material layer capable of doping a donor element is described. However, when a light absorbing layer is composed of an n-type semiconductor, as in the case of forming a doping layer in a light absorbing layer through an impurity material layer capable of doping an acceptor element, an internal electric field such as a p-n junction is formed to reduce the recombination of electrons and holes generated in a semiconductor light absorbing layer and at the same time, the collection efficiency to an electrode is improved, thereby increasing the efficiency of a solar cell.

The present invention includes a case in which the method for forming an internal electric field layer by doping an impurity layer proposed in an embodiment is applied to a single type solar cell composed of only a single element such as Si or Ge, in addition to a compound solar cell.

What is claimed is:

1. A method for preparing a solar cell, comprising:
    forming a first electrode on a substrate; forming a light absorbing layer on the first electrode;
    forming a second electrode on the light absorbing layer,
    forming an impurity material layer including an impurity element on the light absorbing layer adjacent to the first electrode or the second electrode in any one side or both sides thereof; and
    after forming the impurity material layer, forming a doping layer by diffusing the impurity element into a portion of the light absorbing layer through a heat treatment,
    wherein the light absorbing layer is composed of a Cu compound or a Cd compound,
    wherein a p-n junction or an internal electric field layer is formed in the Cu compound or the Cd compound by the doping layer,
    wherein the Cu compound or Cd compound has a binary composition,
    wherein the impurity material layer is composed of a metal oxide containing any one or more of Ti and Si.

2. The method of claim 1, wherein the impurity material layer is formed through a thin film process, or formed by a method of attaching a film containing an impurity material.

3. The method of claim 2, wherein the method of attaching a film comprises:
    preparing a solution by dispersing particles of the impurity material in an organic solvent;
    applying the solution on the light absorbing layer; and
    forming a particle layer of the impurity material by evaporating the solvent.

4. The method of claim 3, wherein the size of the particles of the impurity material is 10 to 100 nm.

5. The method of claim 2, wherein the method of attaching a film comprises:
    forming a film by impregnating the particles of the impurity material into a solvent of a thermoplastic resin and then curing the impregnated particles; and
    adhering the film on the light absorbing layer.

6. The method of claim 5, wherein the size of the particles of the impurity material is 10 to 100 nm.

7. The method of claim 1, wherein the impurity material layer is formed by reactive ion sputtering, and when the impurity material layer is formed, a negative voltage is applied in a range of 0 V to −5 V to accelerate the doping of the impurity element contained in impurities into the light absorbing layer.

8. The method of claim 7, wherein the reactive ion sputtering comprises:
    providing a target having a component of the impurity material and injecting an inert gas and a reactive gas in a vacuum state; and
    forming an oxide by generating plasma to cause the impurity material emitted by means of an Ar ion colliding with the target to react with oxygen plasma.

9. The method of claim 1, wherein the impurity material layer is composed of the metal oxide, and formed by physical vapor deposition (PVD), chemical vapor deposition (CVD), or atomic layer deposition (ALD).

10. The method of claim 9, wherein the metal oxide layer is formed by atomic layer deposition using a precursor containing Ti.

11. The method of claim 9, wherein the metal oxide layer comprises any one of a Ti oxide, a composite oxide of Cu and Ti, and a composite oxide of Cu and Si.

* * * * *